United States Patent
Tokita et al.

(10) Patent No.: US 7,233,383 B2
(45) Date of Patent: Jun. 19, 2007

(54) EXPOSURE APPARATUS, DEVICE MANUFACTURING METHOD, PATTERN GENERATOR AND MAINTENANCE METHOD TO CHECK FOR PIXEL DETERIORATION

(75) Inventors: Toshinobu Tokita, Tochigi (JP); Hirohisa Ota, Saitama (JP); Eigo Kawakami, Tochigi (JP); Takashi Nakamura, Tokyo (JP); Kazuyuki Kasumi, Tochgi (JP)

(73) Assignee: Canon Kabushiki Kaisha, Tokyo (JP)

( * ) Notice: Subject to any disclaimer, the term of this patent is extended or adjusted under 35 U.S.C. 154(b) by 96 days.

(21) Appl. No.: 11/112,695

(22) Filed: Apr. 21, 2005

(65) Prior Publication Data

US 2005/0237375 A1    Oct. 27, 2005

(30) Foreign Application Priority Data

Apr. 21, 2004  (JP) .............................. 2004-126101

(51) Int. Cl.
G03B 27/52      (2006.01)

(52) U.S. Cl. ....................................... 355/30

(58) Field of Classification Search ................ 355/30, 355/53; 356/237.2; 250/222.2, 559
See application file for complete search history.

(56) References Cited

U.S. PATENT DOCUMENTS

| 5,330,878 | A |   | 7/1994 | Nelson |
| 5,412,186 | A |   | 5/1995 | Gale |
| 5,574,276 | A | * | 11/1996 | Ishimaru .................. 250/222.2 |
| 6,379,867 | B1 | * | 4/2002 | Mei et al. .................. 430/296 |
| 6,544,698 | B1 |   | 4/2003 | Fries |
| 6,963,434 | B1 | * | 11/2005 | Latypov ..................... 359/237 |
| 2005/0078284 | A1 | * | 4/2005 | Van De Ven et al. ......... 355/18 |

* cited by examiner

Primary Examiner—Henry Hung Nguyen
Assistant Examiner—Chia-how Michael Liu
(74) Attorney, Agent, or Firm—Morgan & Finnegan LLP

(57) ABSTRACT

An exposure apparatus for exposing a predetermined pattern onto an object via a projection optical system includes a pattern generating unit that includes plural pixels, and generates the predetermined pattern by driving the plural pixels, a measuring unit for measuring at least one of optical performance of the pattern generating unit and a driving state of the plural pixels, and a maintenance unit for maintaining the pattern generating unit based on a measuring result by the measuring unit.

6 Claims, 12 Drawing Sheets

EXPOSURE APPARATUS, DEVICE MANUFACTURING METHOD, PATTERN GENERATOR AND MAINTENANCE METHOD TO CHECK FOR PIXEL DETERIORATION

BACKGROUND OF THE INVENTION

The present invention relates generally to an exposure apparatus, and more particularly to an exposure apparatus used to manufacture various devices including semiconductor chips such as ICs and LSIs, a display device such as a liquid crystal panel, a sensing device such as a magnetic head, an image pick-up device such as a CCD, and a fine pattern for micromechanics. The present invention is suitable, for example, for a maskless exposure apparatus that utilizes a spatial modulation element, such as a micro-mirror array, and a projection type image display unit, such as a projector that displays an image on a screen.

Due to the demand by the large personal computer ("PC") market, the fine processing of the semiconductor integrated circuits ("ICs") has rapidly developed, and the design rule of 90 nm has been achieved. Many devices are produced as highly versatile and marketable microprocessor units ("MPUs") and memories for use with the PCs. These MPUs and the memories use the same devices even for different PC manufacturers and models, and the same semiconductor devices are manufactured in huge quantities.

The information appliances are expected to be the largest market in the future for the semiconductor devices along with the widespread digital TVs, versatile cellular phones, networks, etc. The information appliances use unique semiconductor devices (or system LSIs) suitable for their manufacturers and models, and require the manufacture of various types of devices. The information appliances are designed and produced based on consumers' demands. Various consumers' demands require the manufacture of various products, and limit the number of units produced per model. Individual demands are so fluid that the products need to be put onto the market at the proper times based on the consumers' demands.

For the conventional semiconductor devices typified by the MPUs and memories, the same model can be produced in large quantities over a long time period of time. On the other hand, for the semiconductor devices (or system LSIs) in the information appliances, various types should be produced in small quantities only for a short time period and put onto the market at proper times.

A projection exposure apparatus, which has conventionally been used, projects a circuit pattern of a mask (or a reticle) onto a wafer etc. via a projection optical system and transfers the circuit pattern in a lithography that serves as the important technology for production of the semiconductor devices. For the fine processing and the high integration of the semiconductor devices, the projection exposure apparatus can now transfer a pattern smaller than the exposure wavelength by using, for example, a phase shift mask, etc. The phase shift mask is more complicated and thus more expensive than a conventional binary mask.

If the duplicate device is produced in large quantities, the mask cost per device is reduced. However, when the number of produced system LSIs are low, a mask cost increases, which makes the device and mask expensive, such as the phase shift mask. The information appliances are subject to keen price competitions similar to conventional home electric appliances, and preferably avoid use of expensive semiconductor devices.

Accordingly, use of a direct imaging type of exposure apparatus (or a maskless exposure apparatus) to produce the system LSIs attracts attention. The maskless exposure apparatus uses no mask, and can start producing the devices without producing a mask once a device circuit design is determined. The maskless exposure apparatus eliminates the mask cost, and reduces the device producing time period.

The maskless exposure apparatus includes a pattern generator that has plural pixels, such as a micro-mirror and a liquid crystal, on a substrate. The pattern generator is located at a position corresponding to a mask position in a conventional exposure apparatus, and generates a circuit pattern. See, for example, U.S. Pat. No. 5,330,878. More specifically, the pattern generator generates a circuit pattern by independently driving the pixels and by controlling their reflections and non-reflections of the light.

The pixels in the pattern generator are required to have the mechanical durability to drive. However, adhesion actually restrains the driving between adjacent mirrors and between the mirror and the substrate due to mixture of foreign matter with mirror's deformations.

Accordingly, there are various proposals including microwave irradiations onto the pixels in the pattern generator so as to prevent restraints of driving of each pixel, and continuous driving of each pixel. See, for example, U.S. Pat. Nos. 5,412,186 and 6,544,698.

While the prior art disclose an anti-adhesion approach for the mirror, the instant inventor has discovered that the pattern transfer precision deteriorates due to a change of the mirror's reflectance, etc. For example, while microwave irradiations prevent the mirror's adhesion as taught by U.S. Pat. No. 5,412,186, a defect occurs in a circuit pattern generated by the pattern generator when the reflectance changes as a result of the foreign matter or contaminants adhering to the mirror surface. In other words, the prior art does not consider a change of the optical performance of the mirror.

It is also discovered that the microwave irradiations and mirror's continuous driving do not always prevent the mirror's adhesion.

It is conceivable to exchange the micro-mirror array when the optical performance changes due to the mirror's adhesions. However, a maintenance person needs a long time to exchange and position the micro-mirror array because of the optical-axis alignment in the procedure, causing the lowered throughput of the devices, such as a semiconductor, due to the downtime.

The liquid crystal is subject to similar problems as the micro-mirror array. The liquid crystal has a problem of transmittance changing corresponding to the mirror's reflectance changes, although the liquid crystal does not suffer from a problem corresponding to the mirror's adhesion. A defect occurs in a circuit pattern similar to that in the micro-mirror array when the liquid crystal pixels lower the transmittance.

BRIEF SUMMARY OF THE INVENTION

The present invention is directed to an exposure apparatus and a maintenance method, which improve the maintainability and facilitate an exchange of a pattern generator, as well as preventing defective patterning and lowered productivity of devices, such as a semiconductor.

An exposure apparatus according to one aspect of the present invention includes a projection optical system for projecting a predetermined pattern onto an object to be exposed, a pattern generating unit that includes plural pixels, and generates the predetermined pattern by driving the plural pixels, a measuring unit for measuring at least one of optical performance of the pattern generating unit and a driving state of the plural pixels, and a maintenance unit for maintaining the pattern generating unit based on a measuring result by the measuring unit.

An exposure apparatus according to another aspect of the present invention includes a projection optical system for projecting a predetermined pattern onto an object to be exposed, a pattern generating unit that includes plural pixels, and generates the predetermined pattern by driving the plural pixels, an obtaining unit for obtaining a positional relationship between a position of the predetermined pattern and a position of the object, and a driving unit for driving, based on the positional relationship obtained by the obtaining unit, at least one of a first stage for supporting the pattern generating unit and a second stage for supporting the object.

A device manufacturing method according to another aspect of the present invention includes the steps of exposing an object using the above exposure apparatus, and developing the object that has been exposed.

A pattern generator according to another aspect of the present invention includes a pattern generating unit that includes plural pixels, and generates a predetermined pattern by driving the plural pixels, a measuring unit for measuring at least one of optical performance of the pattern generating unit and a driving state of the plural pixels, and a maintenance unit for maintaining the pattern generating unit based on a measuring result by the measuring unit.

A maintenance method according to another aspect of the present invention for a pattern generator that includes a pattern generating unit that includes plural pixels, and generates a predetermined pattern by driving the plural pixels includes the steps of obtaining at least one of optical performance of the pattern generating unit and a driving state of the plural pixels, and determining, based on information obtained by the obtaining step, whether the plural pixels deteriorate, and maintaining the pattern generating unit based on a determination by the determining step.

A maintenance method according to another aspect of the present invention for a pattern generator that includes a pattern generating unit that includes plural pixels, and generates a predetermined pattern by driving the plural pixels includes an obtaining step of obtaining at least one of optical performance of the pattern generating unit and a driving state of the plural pixels, a first determining step of determining, based on information obtained by the obtaining step, whether the optical performance of the plural pixels deteriorates, a second determining step of determining whether the number of determinations of deterioration is equal to or greater than a predetermined value when the first determining step determines that the optical performance deteriorates, a step of exchanging the pattern generating unit when the second determining step determines that the number of determinations exceeds the predetermined value, and of recovering the optical performance of the pixels when the second determining step determines that the number of determinations is smaller than the predetermined value.

Other objects and further features of the present invention will become readily apparent from the following description of the preferred embodiments with reference to the accompanying drawings.

DETAILED DESCRIPTION OF THE PREFERRED EMBODIMENTS

Figure 1:
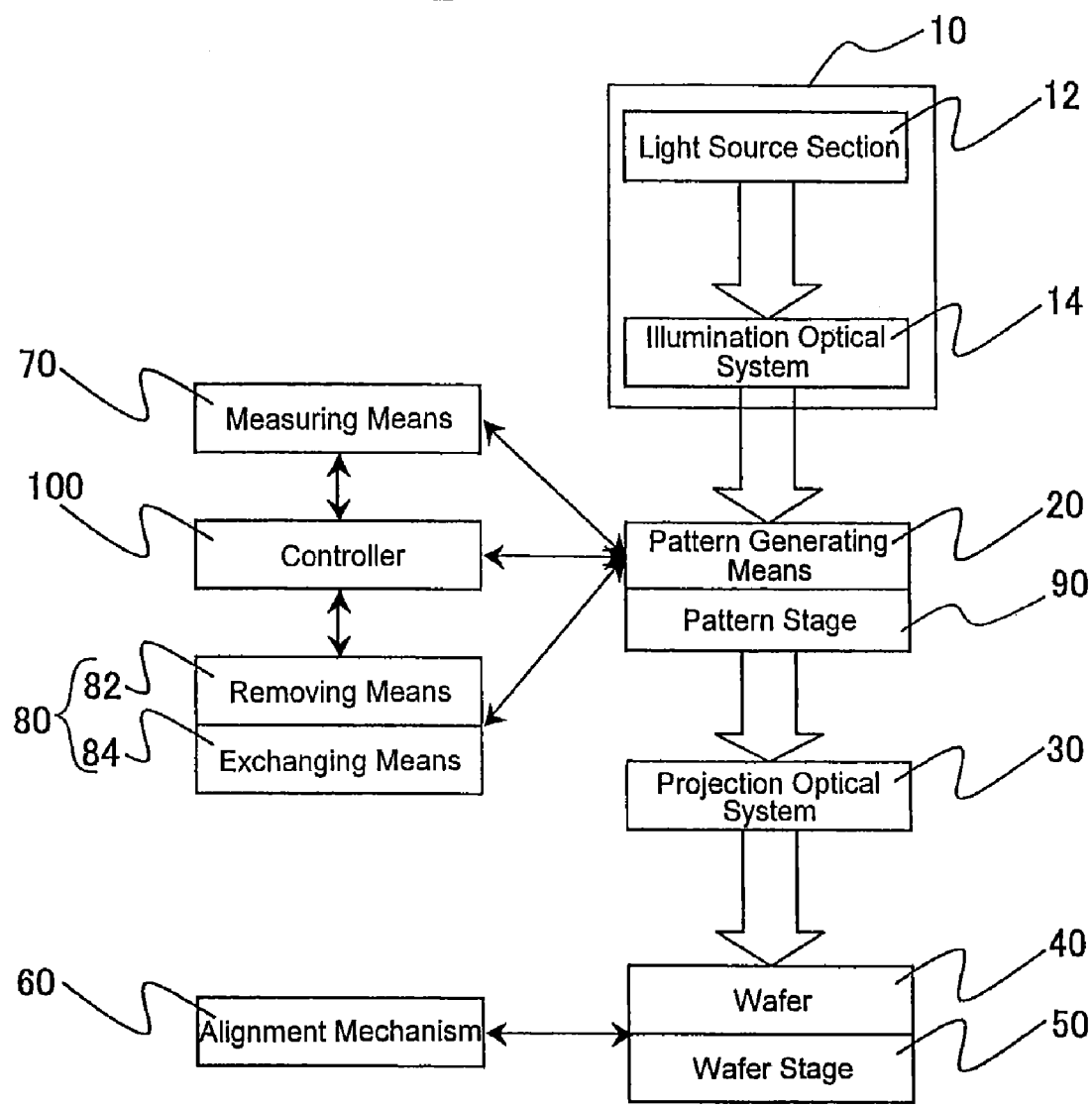
FIG. 1 is a schematic block diagram of a structure of an exposure apparatus according to one aspect of the present invention.

With reference to the accompanying drawings, a description will be given of an exposure apparatus 1 according to one aspect of the present invention. Like elements in each figure are designated by the same reference numerals, and a duplicate description will be omitted. FIG. 1 is a schematic block diagram of a structure of the inventive exposure apparatus 1.

The exposure apparatus 1 is a maskless type projection exposure apparatus that arranges a pattern generating means 20 at a position corresponding to a mask position in an exposure apparatus that uses the mask, and exposes a circuit pattern (or semiconductor integrated circuit) generated by the pattern generating means 20 onto a wafer. Such an exposure apparatus is suitable for a sub-micron or quarter-micron lithography process, for example, for the system LSIs.

The exposure apparatus 1 includes, as shown in FIG. 1, an illumination apparatus 10, a pattern generating means 20, a projection optical system 30, a wafer stage 50 mounted with a wafer 40, an alignment mechanism 60, a measuring means 70, a maintenance means 80, a pattern stage 90, and a controller 100.

The illumination apparatus 10 illuminates the pattern generating means 20 that generates a circuit pattern to be transferred, and includes a light source section 12 and an illumination optical system 14.

The light source section 12 uses, for example, a light source such as an ArF excimer laser with a wavelength of approximately 193 nm and a KrF excimer laser with a wavelength of approximately 248 nm. However, the laser type is not limited to excimer lasers and, for example, an $F_2$ laser with a wavelength of approximately 157 nm and an extreme ultraviolet ("EUV") light having a wavelength of 20 nm or smaller may be used. Similarly, the number of laser units is not limited. For example, speckles caused by the coherence remarkably reduce when two independently operating solid lasers are used. An optical system (not shown) for reducing speckles may swing linearly or rotationally on the optical path. A light source applicable for the light source section 12 is not limited to a laser, and may use one or more lamps such as a mercury lamp and a xenon lamp.

The illumination optical system 14 is an optical system that illuminates the pattern generating means 20 using the light emitted from the light source section 12, and includes a lens, a mirror, an optical integrator, a stop and the like, for example, a condenser lens, a fly-eye lens, an aperture stop, a condenser lens, a slit, and an imaging optical system in this order. The illumination optical system 14 can use any light regardless of whether it is axial or non-axial light. The light integrator may include a fly-eye lens or an integrator formed by stacking two sets of cylindrical lens array plates (or lenticular lenses), and can be replaced with an optical rod or a diffractive optics.

The pattern generating means 20 serves to generate a circuit pattern as an original, and includes a micro-mirror array and a liquid crystal, which controls driving of plural pixels independently and generates the pattern. This embodiment uses a micro-mirror array for the pattern generating means 20. The micro-mirror array arranges many fine plane mirrors (about 16 μm square) that are formed by the micro electromechanical systems ("MEMS") technology. The micro-mirror array drives the plane mirrors and controls their reflections and non-reflections of the light so as to generate the pattern. The micro-mirror array generally has millions of mirrors, or thousands of mirrors times thousands of mirrors lengthwise and crosswise.

The projection optical system 30 projects a reduced size of the circuit pattern generated by the pattern generating means 20, onto the wafer 40. The projection optical system 30 may use an optical system comprising solely of a plurality of lens elements, a (catadioptric) optical system including a plurality of lens elements and at least one concave mirror, an optical system including a plurality of lens elements and at least one diffractive optical element such as a kinoform, a full mirror type optical system, and so on. Any necessary correction of the chromatic aberration may be accomplished by using a plurality of lens units made from glass materials having different dispersion values (Abbe values) or arranging a diffraction optics such that it disperses light in a direction opposite to that of the lens unit.

The wafer 40 is an object to be exposed, and Photoresist is applied to the wafer 40. The circuit pattern generated by the pattern generating means 20 is exposed onto the wafer 40. The wafer 40 is replaced with a liquid crystal substrate and another object to be exposed.

The wafer stage 50 supports the wafer 40 via a wafer chuck (not shown), and is connected to a moving mechanism (not shown). The moving mechanism (not shown) uses, for example, a linear motor to move stepwise or scans a transferred position on the wafer 40. The wafer stage 50 is installed on a stage stool supported on the floor and the like, for example, via a dampener. The projection optical system 30 is installed on a barrel stool (not shown), for example, via a dampener, to the base frame placed on the floor.

The alignment mechanism 60 measures a positional relationship between the position of the wafer 40 and the optical axis of the projection optical system 30, and sets the position and angle of the wafer stage 50 so that the projected image of the pattern generating means 20 accords with the predetermined position of the wafer 40. The alignment mechanism 60 maintains the wafer 40 surface at the imaged position of the projection optical system 30 during exposure, and measures the focus position on the wafer 40 surface. The alignment mechanism 60 may measure a positional relationship between a position of a circuit pattern generated by the pattern generating means 20 and the optical axis of the projection optical system 30.

Figure 2:
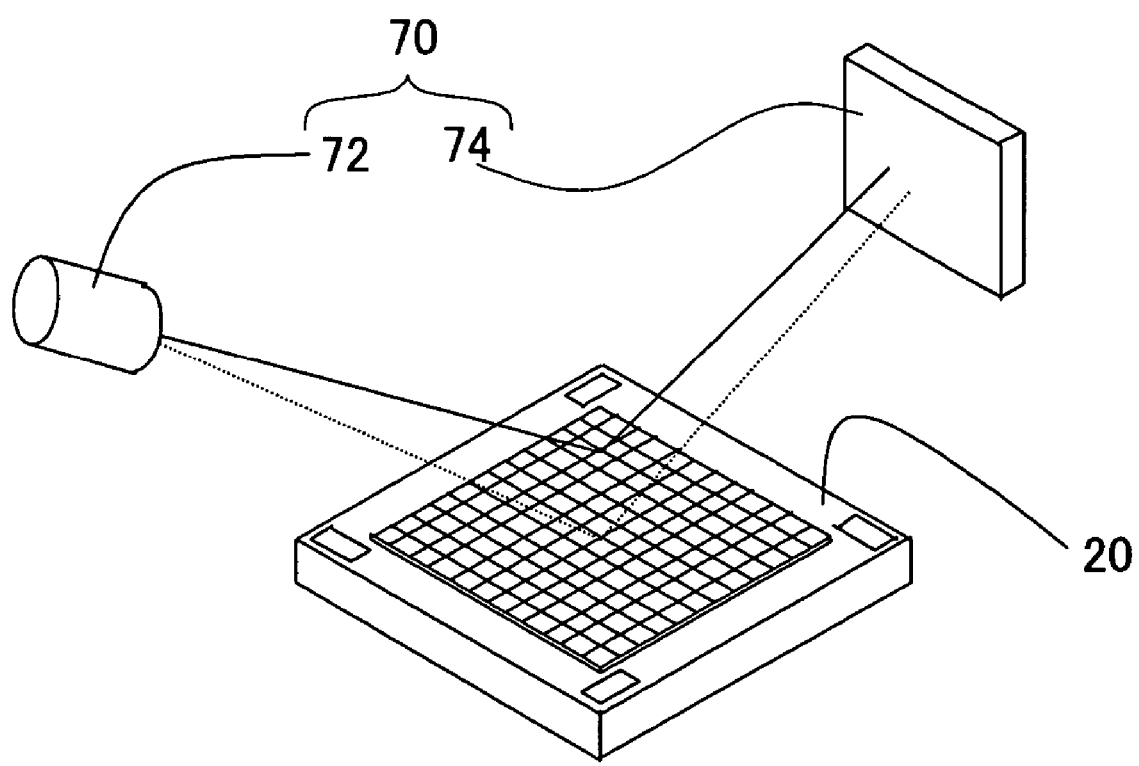
FIG. 2 is a schematic perspective view that illustrates one exemplary structure of a measuring means shown in FIG. 1.

The measuring means 70 serves to measure the optical performance of the pixels in the pattern generating means 20, and includes, as shown in FIG. 2, an irradiating part 72, and a light receiving part 74. In the measuring means 70, the light irradiated from the irradiating part 72 onto the pattern generating means 20 is reflected by the pattern generating means 20 (or fine plane mirrors), and received by the light receiving part 74. Here, FIG. 2 is a schematic perspective view that illustrates an exemplary structure of the measuring means 70.

In FIG. 2, the reflection state of each plane mirror is measured while all the plane micro-mirrors in the pattern generating means 20 are made reflectible. It is preferable to measure the reflectance from the reflected light intensity instead of merely determining whether each plane mirror reflects the light. This configuration enables the time variations to be recognized when foreign matters or contaminants adhere to the pixel surface and the reflectance changes after a long time use of the pattern generating means 20.

The measuring means 70 in this embodiment measures the reflectance state of each plane mirror while all the plane micro-mirrors in the pattern generating means 20 are made reflectible. Alternatively, all the plane mirrors may be made non-reflectible when measuring the reflection state of each plane mirror. Preferably, the reflection state of each plane mirror is measured on both conditions. Where the reflection state of each mirror is measured for both reflectible and non-reflectible states, the deterioration is easily determined when some pixels are damaged in the pattern generating means 20 and when the reflectance changes due to adhesion of foreign matter or contaminants.

Since the pattern generating means 20 in this embodiment is a micro-mirror, the measuring means 70 measures the reflectance of each pixel. If the pattern generating means 20 is a liquid crystal, the transmittance is measured by the light intensity that transmits through each pixel.

The maintenance means 80 serves to maintain the pattern generating means 20. The maintenance means 80 in this embodiment includes a removing means 82 for removing foreign matters adhering to the pixels on the pattern generating means 20, and an exchanging means 84 for exchanging the pattern generating means 20.

Figure 3:
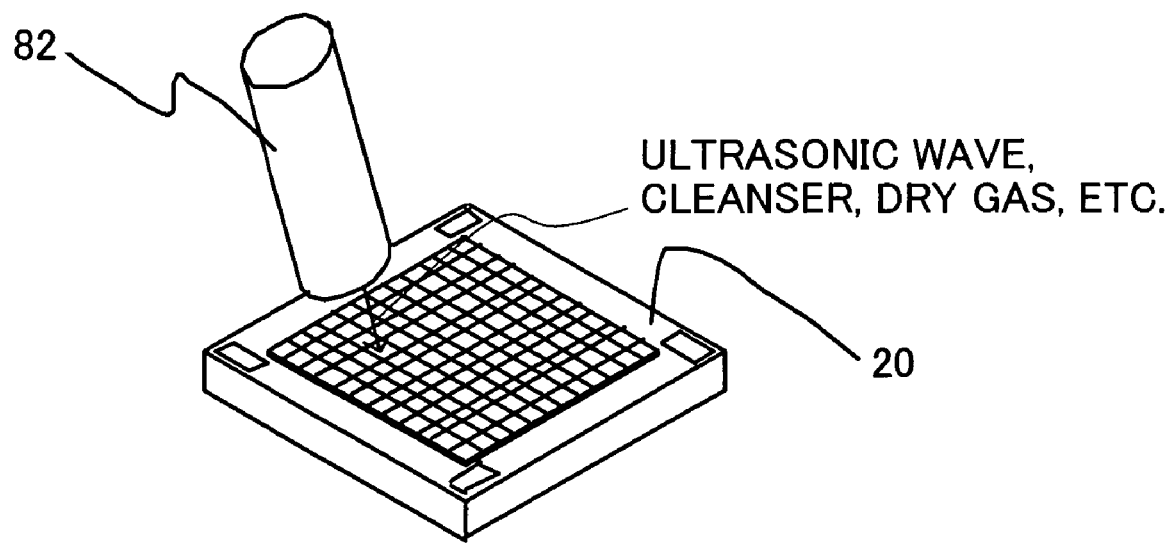
FIG. 3 is a schematic perspective view that illustrates one exemplary structure of a removing means shown in FIG. 1.

The removing means 82 is implemented, as shown in FIG. 3, an ultrasonic irradiation part that irradiates the ultrasonic wave to the pixels in the pattern generating means 20, a liquid dropping unit that drops a cleanser onto the pixels in the pattern generating means 20, or an injector that injects dry gas, such as nitrogen and dry air. As described above, the deterioration of the pixel of the pattern generating means 20 is mainly caused by the adhesion of the foreign matter or contaminants. Accordingly, the methods for irradiating the ultrasonic wave to the deteriorated pixel for removing the foreign matter, for dropping the cleanser for removing the foreign matter, and for blowing the dry gas for removing the foreign matter. However, the removing means 82 is not limited to this embodiment as long as it effectively removes the foreign matter from the pixels. Here, FIG. 3 is a schematic perspective view that illustrates one exemplary structure of the removing means 82.

Figure 4:
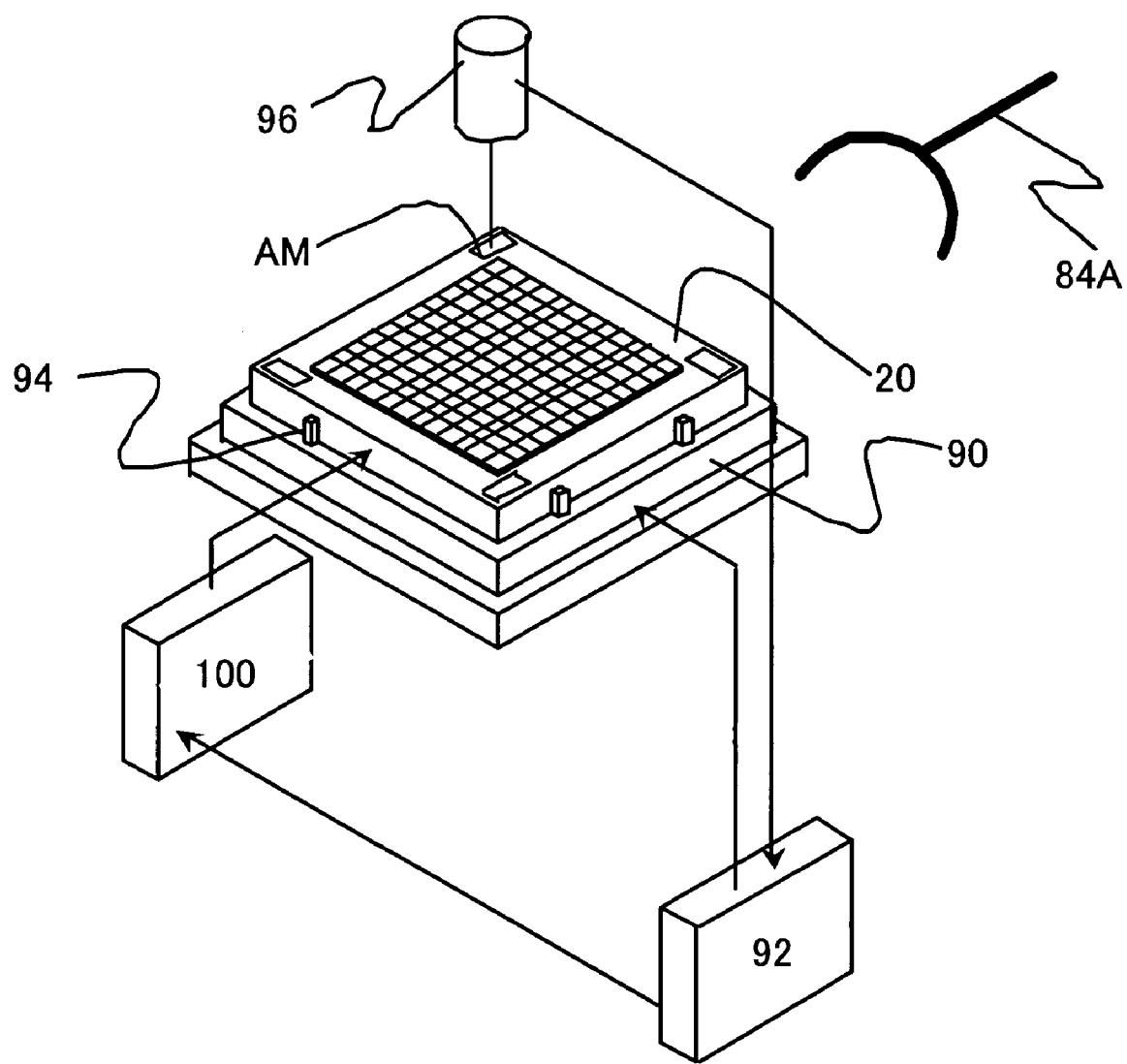
FIG. 4 is a schematic perspective view that illustrates exemplary structures of an exchanging means and a pattern stage shown in FIG. 1.
Figure 5:
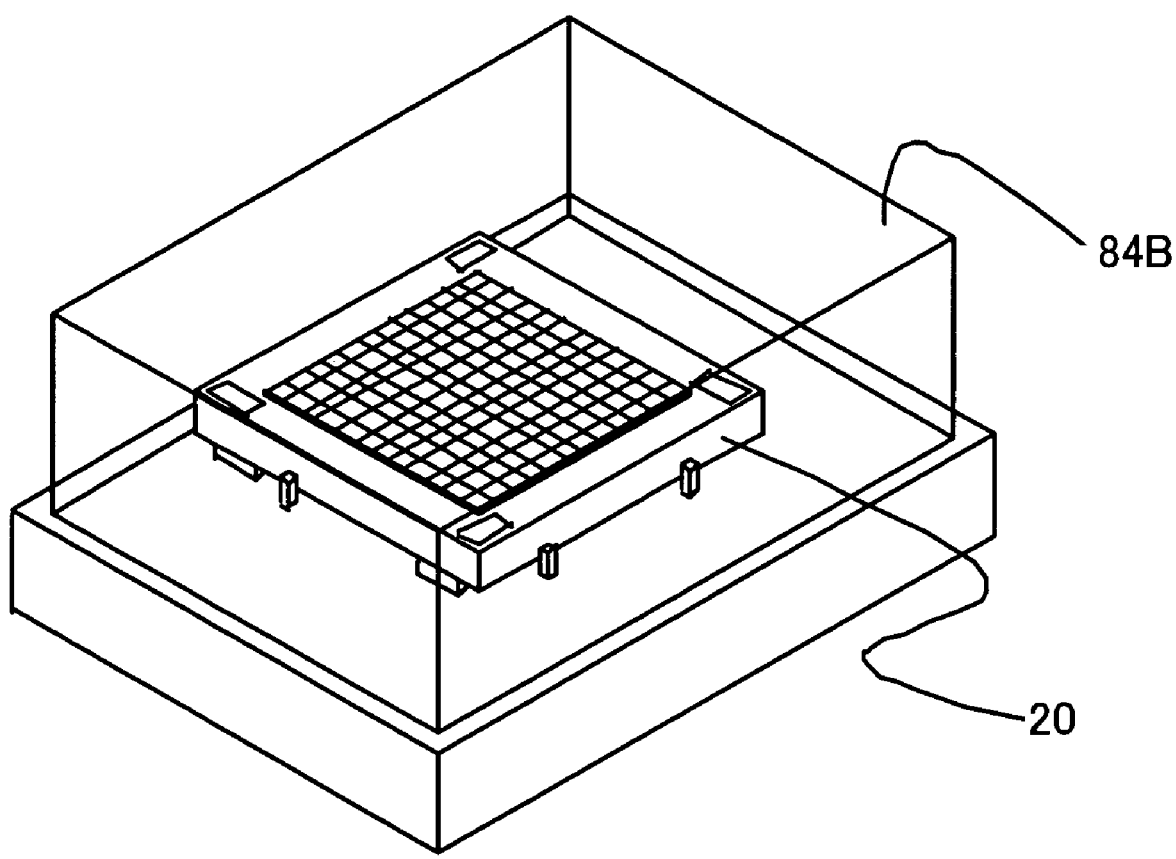
FIG. 5 is a schematic perspective view that illustrates a pattern generating means housed in a cassette.

The exchanging means 84 serves to exchange the pattern generating means 20. The exchanging means 84 in this embodiment includes, as shown in FIG. 4, a hand-shaped transporting means 84A, that holds a predetermined part of the pattern generating means 20 in an electrostatic manner or a vacuum manner, and transports the pattern generating means 20 to the pattern stage 90, which will be described later. When exchanging the pattern generating means 20, the pixels of the pattern generating means 20 are exposed and the contaminants or the foreign particles adhere to and deteriorate the pixels. Therefore, as shown in FIG. 5, the pattern generating means 20 should be housed in the cassette 84B. In other words, the cassette 84B serves to maintain cleanliness in exchanging the pattern generating means 20. Of course, in this case, the transporting means 84A transports the cassette 84B that houses the pattern generating means 20. Here, FIG. 4 is a schematic perspective view that illustrates exemplary structures of the exchanging means 84 and the pattern stage 90. FIG. 5 is a schematic perspective view that illustrates the pattern generating means 20 that is housed in the cassette 84B.

The pattern stage 90 is mounted with the pattern generating means 20, and connected with a driving part 92. The pattern stage 90 serves to position the pattern generating means 20 in place in the exposure apparatus 1. The driving part 92 is made, for example, of a linear motor, and moves the pattern generating means 20.

The pattern stage 90 includes a positioning mechanism for positioning the pattern generating means 20, as shown in FIG. 4, and the positioning mechanism is implemented by a positioning pin 94. The positioning pin 94 positions the pattern generating means 20 at a butting precision. Thereby, the pattern generating means 20 transported by the transporting means 84A contacts the positioning pin 94, and is held by the pattern stage 90. The positioning mechanism is not limited to the positioning pin 94 as long as the mechanical butt is available.

The positional offset of the pattern generating means 20 in the exposure apparatus 1 is calculated, as shown in FIG. 4, as an alignment scope 96 measures an alignment mark AM patterned on the pattern generating means 20. The driving part 92 moves the pattern stage 90 in accordance with the measuring result, and positions the pattern generating means 20 in place.

A positioning method of the pattern generating means is not limited to this embodiment. For example, the pattern stage 90 may be omitted. In this case, it is necessary that the alignment scope 96 measures a positional offset amount of the pattern generating means 20 in the exposure apparatus 1, and a pixel position for the pattern generated by the pattern generating means 20 is shifted and corrected by the positional offset amount.

The controller 100, which will be described later, processes a positional offset amount measured by the alignment scope 96, which corresponds to positional information of the pattern generating means 20 or offset coordinate information of the pattern generating means 20. The controller 100 preferably controls the pattern generating means 20 (or produces the circuit pattern data) and generates the pattern based on the offset coordinate information. According to another effective method, the alignment scope 96 measures a positional offset amount of the pattern generating means 20, and the amount corresponding to the positional offset amount is reflected in positioning of the wafer stage 50.

The controller 100 includes a CPU and memory (not shown), and controls operations in the exposure apparatus 1. The controller 100 is electrically connected to the illumination apparatus 10, the pattern generating means 20, (the moving mechanism (not shown) in) the wafer stage 50, the measuring means 70, the maintenance means 80, (the driving part 92 in) the pattern stage 90. The CPU includes any processor irrespective of its name, such as an MPU, and controls operations of each component. The memory includes a ROM and RAM, and stores a firmware that operates the exposure apparatus 1.

The controller 100 controls pattern generations by the pattern generating means 20. The controller 100 obtains the pattern to be imaged via an interface (not shown), and generates pattern data (pixel coordinate information) for each exposure shot, and controls driving of each pixel in the pattern generating means 20 in accordance with the generated pattern data.

The controller 100 in this embodiment controls maintenance of the pattern generating means 20 or the maintenance means 80 based on the measurement result by the measuring means 70. In other words, the controller 100 serves to determine whether the pixels in the pattern generating means 20 deteriorate.

A description will now be given of how the controller 100 determines whether the pixels of the pattern generating means 20 deteriorate. First, the controller commands the pattern generating means 20 to drive the pixels corresponding to the circuit pattern. The controller 100 acquires driving information of the pattern generating means 20, and stores it as characteristic data. The characteristic data includes responsiveness to the driving commands for each pixel, and driving stroke, the cumulative driving times, etc. The characteristic data preferably contains the optical performance of the pattern generating means 20 measured by the measuring means 70 (or the reflectance when the pattern generating means 20 is the micro-mirror array and the transmittance when the pattern generating means 20 is the liquid crystal).

When the responsiveness, which is one characteristic data and corresponds to the driving command for a predetermined pixel, changes outside a permissible range, the controller 100 determines that the pixel deteriorates. For example, if a permissible changing amount of the responsiveness is 10% and the initial responsiveness is 1 KHz, the controller 100 determines that the pixel deteriorates when the responsiveness is equal to or smaller than 900 kHz or equal to or larger than 1.1 kHz. If the permissible driving stoke is 10% and the initial driving stroke is 10 µm (or 1 mrad), the controller 100 determines that the pixel deteriorates when the driving stroke is equal to or smaller than 9 µm (or 900 µrad) or equal to or smaller than 11 µm (or 900 µrad). When the pixel is driven with the cumulative driving time exceeding the predetermined number, the controller determines that the pixel deteriorates.

Figure 6:
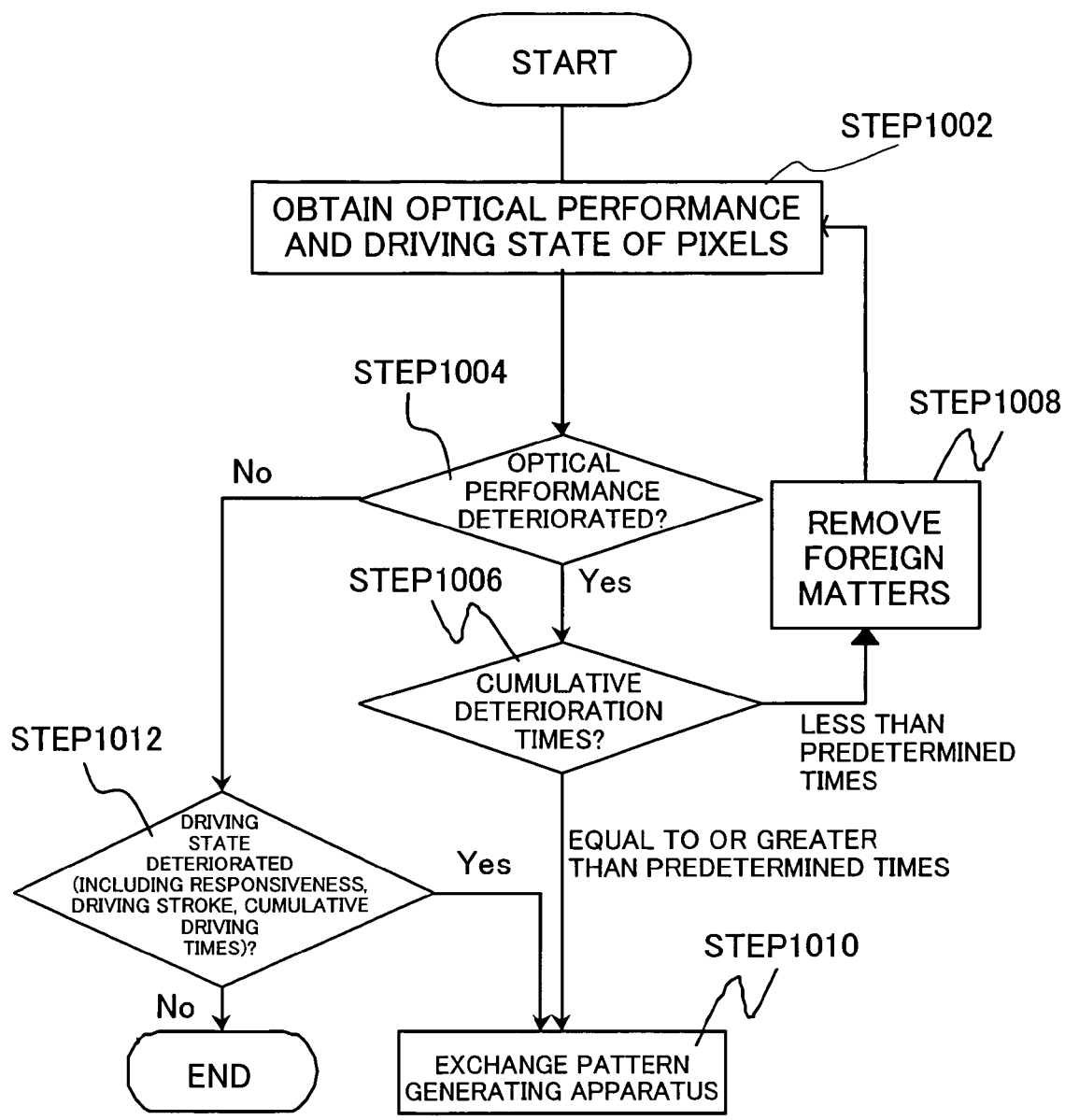
FIG. 6 is a flowchart for explaining a maintenance method according to one aspect of the present invention.

"Referring now to FIG. 6, a description will be given of a maintenance method of the pattern generating means 20 in the exposure apparatus 1. FIG. 6 is a flowchart for explaining the maintenance method according to one aspect of the present invention."

Referring to FIG. 6, the controller 100 first obtains the optical performance and driving states of plural pixels in the pattern generating means 20 (step 1002). The controller 100 then determines whether the optical performance of each pixel in the pattern generating means 20 deteriorates (step 1004). Since the pattern generating means 20 in this embodiment is the micro-mirror array, the pixel is determined to deteriorate when the reflectance changing amount of each pixel is outside the permissible range or, for example, when the reflectance is lower than a predetermined value. When the pixel's reflectance does not change or the pixel's changing reflectance is within the permissible range, the controller 100 does not determine amount of deterioration. If the pattern generating means 20 is a liquid crystal, the pixel is determined to deteriorate when pixel's transmittance changing amount is outside the permissible range or, for example, when the transmittance becomes lower than a predetermined value.

When the controller 100 determines that the optical performance deteriorates in step 1004, then the controller 100 determines whether the number of determinations of deterioration (or the cumulative deterioration number) exceeds a predetermined value (step 1006). This embodiment classifies the following maintenance processes for each pixel in accordance with a result of determination of whether or not the cumulative deterioration times of the optical performance exceeds the predetermined value.

When the cumulative deterioration times of the optical performance is below the predetermined value in step 1006, it is likely that the foreign matters is adhering to the pixel and the removing means 82 is used to remove the foreign matters from the pixel (step 1008). In order to confirm whether the foreign matter adhered to the pixel has been removed (or the optical performance of the pattern generating means 20 has recovered), the optical performance of the pixel from which the foreign matters have been removed is again obtained (step 1002), and the controller 100 determines again whether the optical performance deteriorates (step 1004).

When the cumulative deterioration time of the optical performance is equal to or higher than the predetermined value in step 1006, it is likely that the pixel is broken and the exchanging means 84 exchanges the pattern generating means 20 (step 1010).

On the other hand, when the controller 100 determines that the optical performance does not deteriorate in step 1004, then the controller 100 determines whether or not the pixel's driving state deteriorates (step 1012). Here, as described above, the deterioration is determined based on at least one of the following factors: responsiveness to the driving of the pixels, the driving stroke, the cumulative driving times, etc.

When the controller 100 determines that the pixel's driving state deteriorates in step 1012, it is likely that the pixel is broken due to multiple adhesions and the exchanging means 84 exchanges the pattern generating means 20 (step 1010). The maintenance ends when it is determined that the pixel's driving state does not deteriorate.

"This maintenance method is preferably executed at the initialization of the exposure apparatus 1, because the foreign matter adhered to the pixels in the pattern generating means 20 is removed or the pattern generating means 20 is exchanged before the exposure apparatus 1 is operated. While this embodiment determines that the pixel deteriorates when the cumulative deterioration time is equal to or greater than the predetermined value in step 1006, this predetermined value is arbitrary. For example, the predetermined value may be one, and the pattern generating means 20 may be exchanged without removing the foreign matter adhered to the pixels. This is true of the predetermined times (for the cumulative deterioration times of the driving state) in step 1012."

"Thus, the exposure apparatus 1 and the maintenance method can easily determine a deterioration of the pattern generating means 20, and prevents the lowered throughput and resolution. When the optical performance of the pattern generating means 20 deteriorates, the removing means 82 recovers the pixel. Even when the removing means 82 cannot recover the optical performance of the pattern generating means 20 (or when the pattern generating means 20 is broken), the pattern generating means 20 can be easily exchanged and positioned with high precision."

Figure 7A:
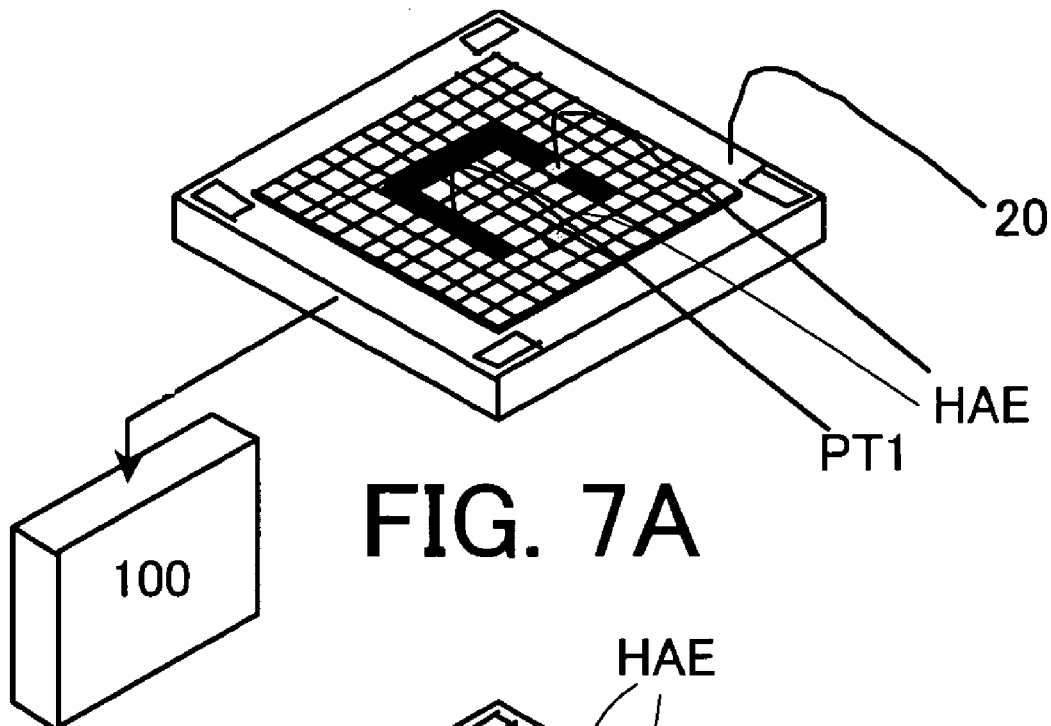
FIGS. 7A and 7B are perspective views for explaining a method for generating a desired pattern while restraining driving of pixels having a high working efficiency.
Figure 7B:
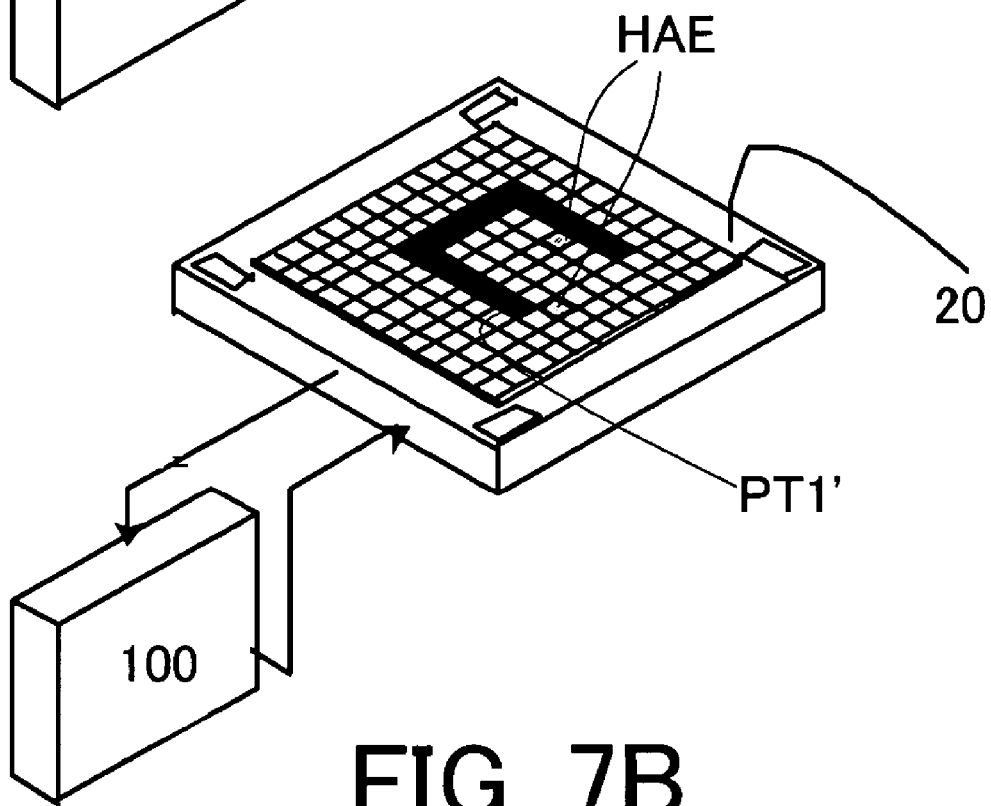

The above description discusses a deterioration of the pattern generating means 20 and a removal of the adhered foreign matters or an exchange of the pattern generating means 20. The following description will discuss a method for generating a desired pattern while restraining driving of any pixels that have the high working efficiency and are likely to deteriorate so as to extend the working life of "For example, as shown in FIG. 7, suppose that there is a pixel HAE having a high working efficiency on a pattern PT1 to be generated, in generating a U-shaped pattern PT1 using the pattern generating means 20. In this case, the driving information of the pattern generating means 20 (regarding the pixel coordinate of the pixel HAE having the high working efficiency) is sent to the controller 100, and the controller 100 commands the pattern generating means 20 to generate the pattern PT1' without using the pixel HAE as shown in FIG. 7B. The generated pattern PT1' is offset by the number of pixels corresponding to the pixel HAE relative to the wafer 40. Thus, a correction by driving the wafer stage 50 is needed. Accordingly, the controller 100 positions the wafer stage 50 by providing the wafer stage 50 with information of the offset pixels as the offset coordinate information. Thereby, the pattern PT1', which is generated at an offset position so as not to drive the pixel HAE, is aligned with the exposure position of the wafer 40. Here, FIGs. 7A and 7B are perspective views for explaining a method for generating the desired pattern while restraining driving of the pixel having the high working efficiency."

Figure 8A:
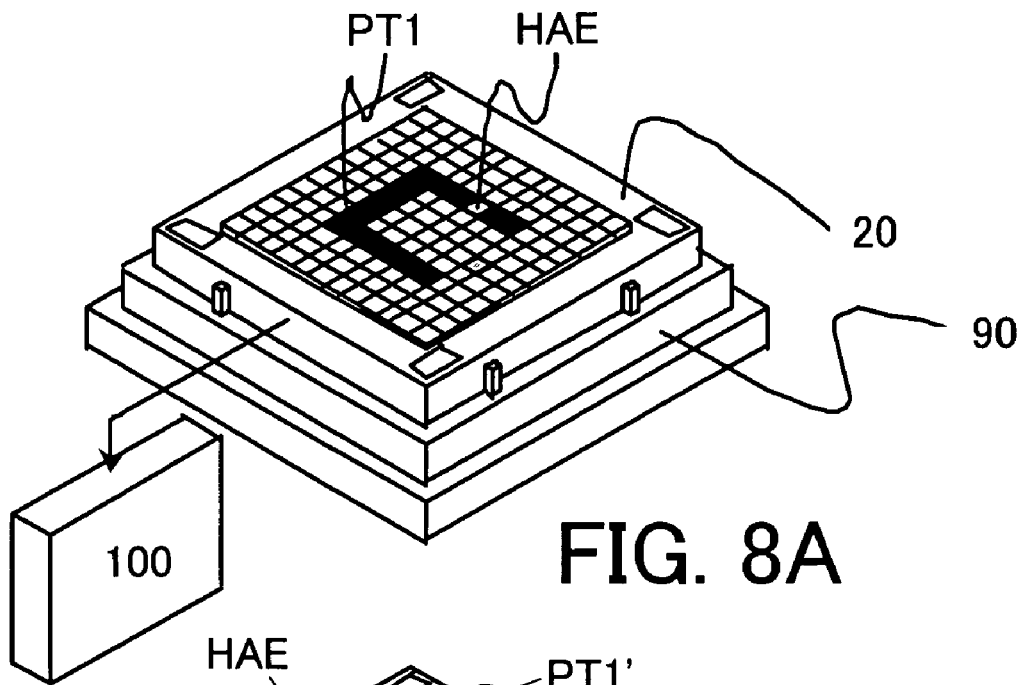
FIGS. 8A and 8B are perspective views for explaining a method for generating a desired pattern while restraining driving of pixels having a high working efficiency.
Figure 8B:
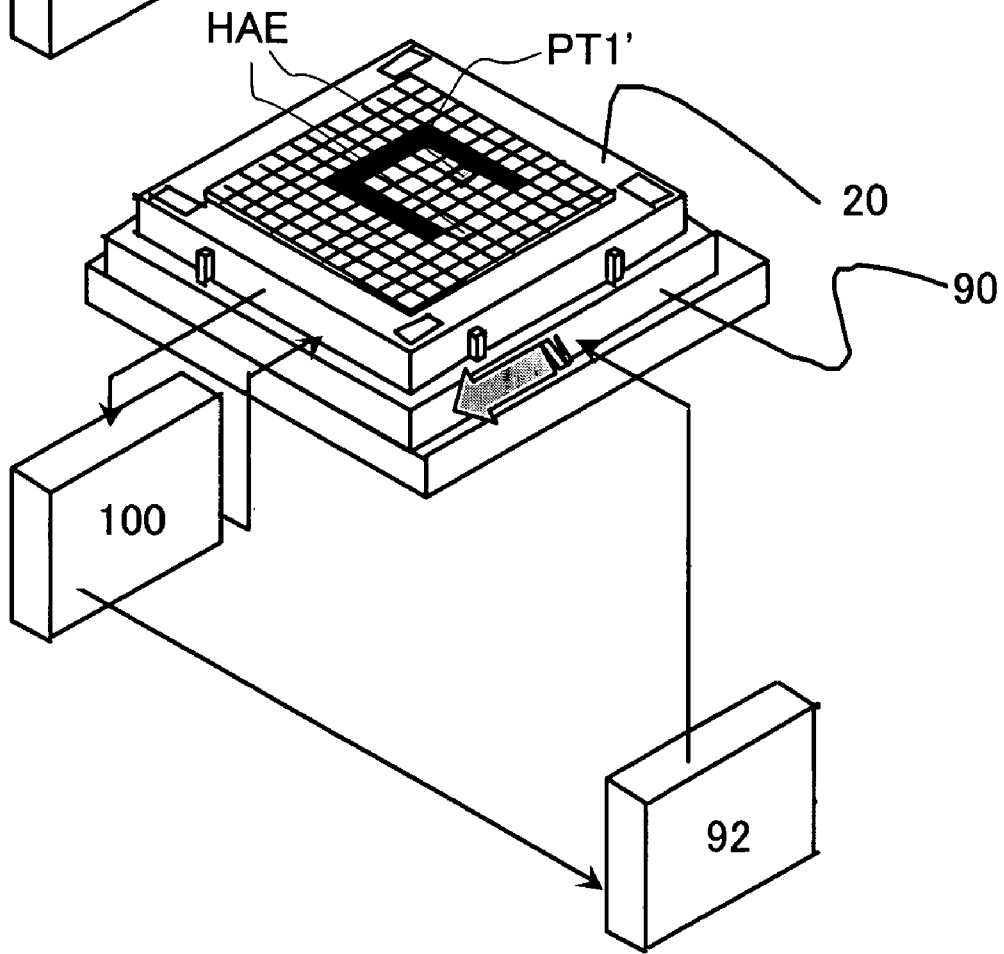

Suppose that the pattern stage 90 holds the pattern generating means 20, and the pixel HAE is located, as shown in FIG. 8A, on the U-shaped pattern P1 to be generated. In this case, the driving information of the pattern generating means 20 (or pixel coordinate indicative of the pixel HAE) is sent to the controller 100, and the controller 100 commands the pattern generating means 20 to generate the pattern PT1' without using the pixel HAE as shown in FIG. 8B. The generated pattern PT1' shifts by the number of pixels corresponding to the pixel HAE relative to the wafer 40, and this embodiment corrects the shift by driving the pattern stage 90. The controller 100 provides the driving part 92 with the number of shifted pixels as the offset coordinate information. The driving part 92 drives the pattern stage 90, and moves the pattern generating means 20 by the number of pixels corresponding to the pixel HAE. This configuration can align the pattern PT1', which is generated at an offset position so as not to drive the pixel HAE, with the exposure position on the wafer 40. Here, FIGS. 8A and 8B are perspective views for explaining a method for generating the desired pattern while restraining driving of the pixel having the working efficiency.

Thus, the exposure apparatus 1 can restrain driving of the pixel having the high working efficiency of the pattern generating means 20, and extends the working life of the pattern generating means 20.

"The pixel to be restrained to drive is not limited to the pixel having the high working efficiency. For example, even when some pixels deteriorate, the exchange frequency of the pattern generating means 20 reduces and the working life of the pattern generating means 20 substantially extends, when the pattern is generated without the deteriorated pixel or by maximizing the deteriorated pixel, and when the position is corrected by the wafer stage 50 and the pattern stage 90. In order to maximize the deteriorated pixel, for example, a pattern generating position may be offset so that the pattern can be generated even when a pixel does not reflect the light where the pattern generating means 20 is the micro-mirror array, and the pixel deteriorates, causes adhesions and does not always reflect the light. When a pixel deteriorates and causes adhesions, and always reflects the light, the pattern generating position may be offset so that the pattern is generated even when the pixel deteriorates. When there are many deteriorated pixels and no pattern generation is possible, the pattern generating means 20 is exchanged in accordance with the maintenance method."

Figure 9A:
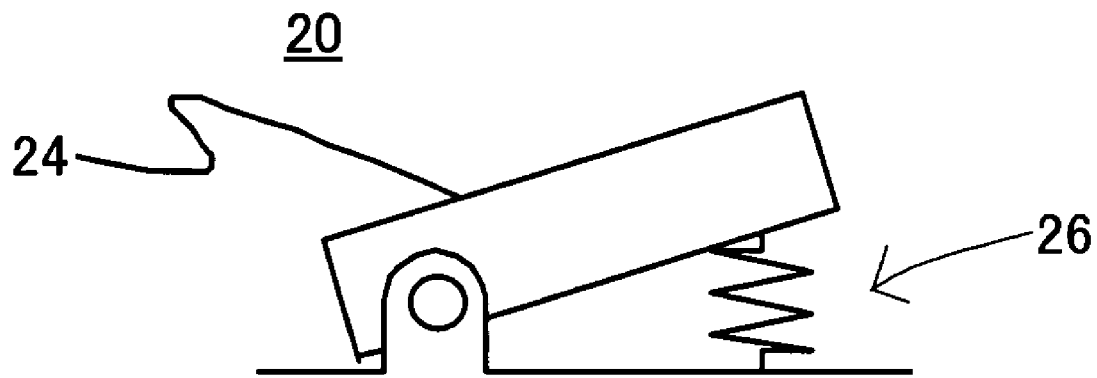
FIGS. 9A and 9B are enlarged sectional views showing one pixel in the pattern generating means shown in FIG. 1.

"The pattern generating means 20 may have a structure that extends its working life. FIG. 9 is an enlarged sectional view showing one pixel 24 in the pattern generating means 20. For example, when the pattern generating means 20 is the micro-mirror array, and the pixel 24 has a spring structure 26 as shown in FIG. 9A, the driving load reduces and is less likely to deteriorate. Even when the pixel 24 cannot be driven, the adhesion position is easily fixed by the spring shrinkage. Therefore, when the pixel 24 in the pattern generating means 20 in the exposure apparatus 1 cannot be driven, the erroneous exposure is prevented by correcting the pattern generating position and the position of the wafer stage 50, etc."

Figure 9B:
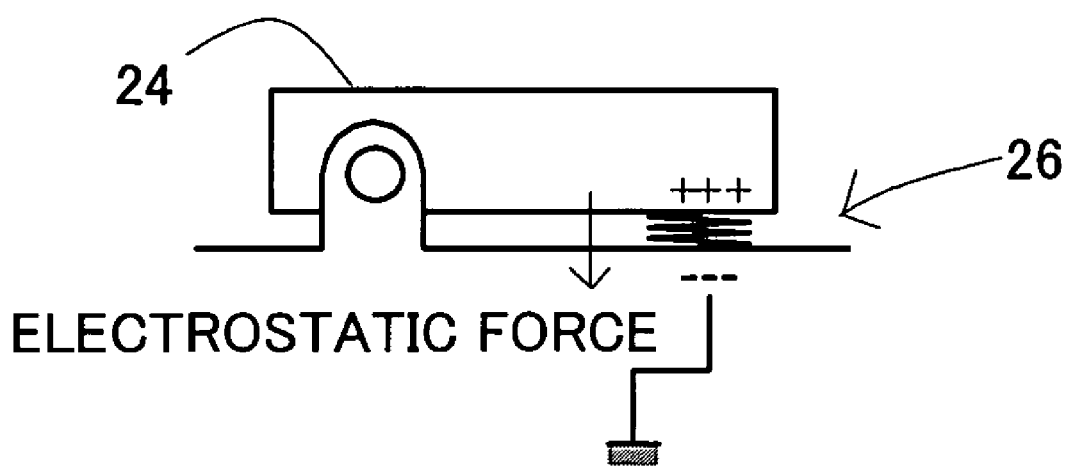

In FIG. 9A, the spring mechanism 26 determines a normal position of the pixel 24. The normal position is a position that provides the maximum or minimum reflectance or transmittance, and is maintained when the power supply stops, for example, due to the power breakdown. For example, in the pattern generating means 20 that sets the normal position to the pattern non-generating side, the pixel 24 is driven to the pattern generating side by using the electrostatic force as shown in FIG. 9B. While this embodiment sets the normal position of the pixel 24 to the pattern non-generating side, but the present invention is not limited to this embodiment and the pattern generating side may be set to the normal position.

Figure 10A:
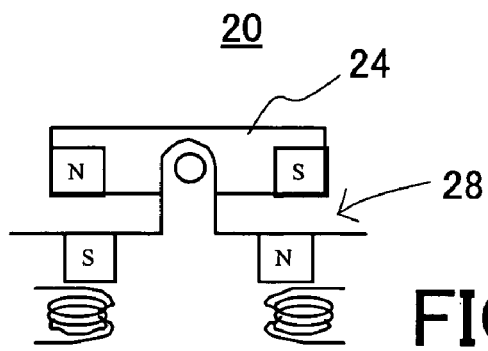
FIGS. 10A to 10C are enlarged sectional views showing a pixel having a latch structure in the pattern generating means shown in FIG. 1.
Figure 10B:
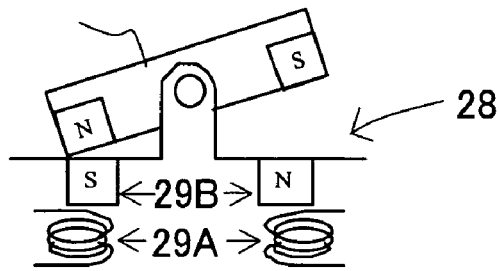

The pixel 24 is not limited to have a normal position shown in FIGS. 9A and 9B, and may have a latch mechanism 28 shown in FIGS. 10A and 10B. FIGS. 10A and 10B are enlarged sectional views of the pixel 24 having the latch mechanism 28 in the pattern generating means 20. For example, in FIG. 10A, the pixel 24 is located at the middle position, and inclined by electrifying right and left coils 29A as shown in FIG. 10B. Even when the electrification to the coil 29A stops, a magnet 29B can maintain the inclination. While FIG. 10B inclines the pixel 24 to the left side, the pixel 24 may be similarly inclined to the right side.

Figure 10C:
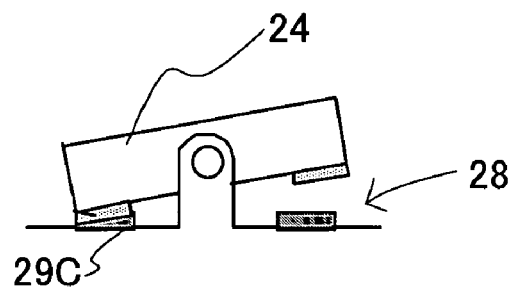

"The present invention is not limited to this embodiment that arranges the coil 29A at the left and right sides of the pixel 24, as shown in FIGS. 10A and 10B, and may arrange the coil only on one of the sides of the pixel 24. For example, when the coil 29A is arranged only at the left side, the current flows for the leftward inclination so that the coil 19A forms the S-pole and the current flows for the rightward inclination so that the coil coil 29A is forms the N-pole. The latch structure 28 may use a pressure sensitive adhesive 29C as shown in FIG. 10C, in addition to the electrostatic force and the magnetic force."

When the pixel of the pattern generating means 20 has a normal position, only pixels necessary to produce the pattern may be driven and other pixels do not have to be driven. This configuration extends the working life of the pixel and the working life of the pattern generating means 20 substantially. Moreover, even when a pixel cannot be driven, an adhesion position (or normal position) is determined. Thus, positions of the pattern stage 90 and the wafer stage 50 may be corrected by maximizing the adhered pixels so as to generate a pattern. When a pixel of the pattern generating means 20 has a latch structure, each pixel may be controlled only during the driving time period. Thus, the electrostatic force and the magnetic force do not have to be applied after latching, and the working life of the pattern generating means 20 can be extended. In addition, the malfunction can be restrained.

In exposure of the exposure apparatus 1, the light emitted from the light source section 12, for example, Koehler-illuminates the patterning means 20 through the illumination optical system 14. The light that has passed (transmitted through or been reflected by) the patterning means 20 and reflects the circuit pattern forms an image on the wafer 40 through the projection optical system 30.

Since the exposure apparatus 1 can restrain the defective patterning by the pattern generating means 20 and reduces the exchange frequency due to the above maintenance method etc., the exposure apparatus 1 can provide devices (such as semiconductor devices, LCD devices, image pickup devices (such as CCDs), and thin film magnetic heads) with high throughput and economical efficiency.

Figure 11:
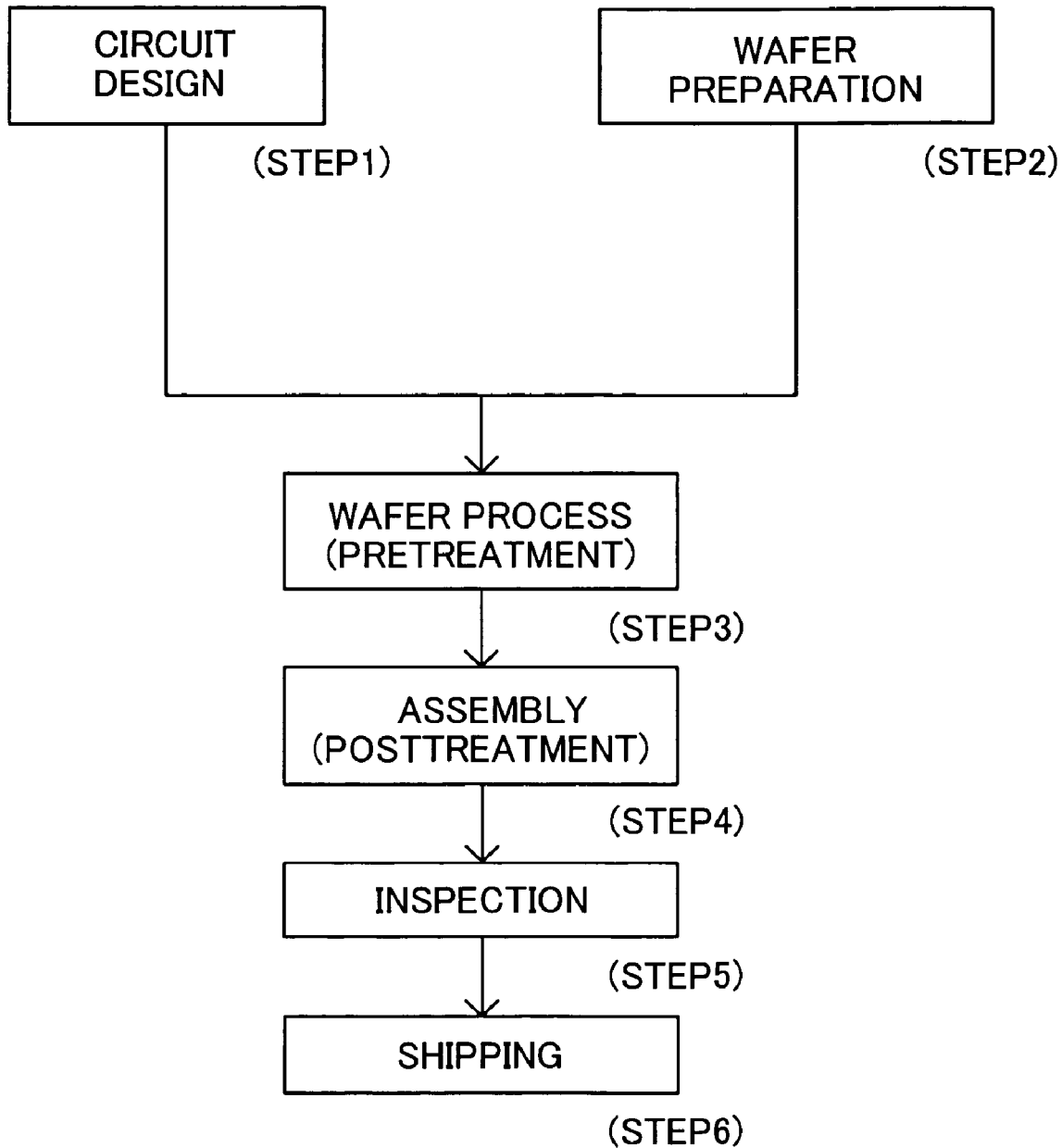
FIG. 11 is a flowchart for explaining a method for fabricating devices (semiconductor chips such as ICs, LSIs, and the like, LCDs, CCDs, etc.).
Figure 12:
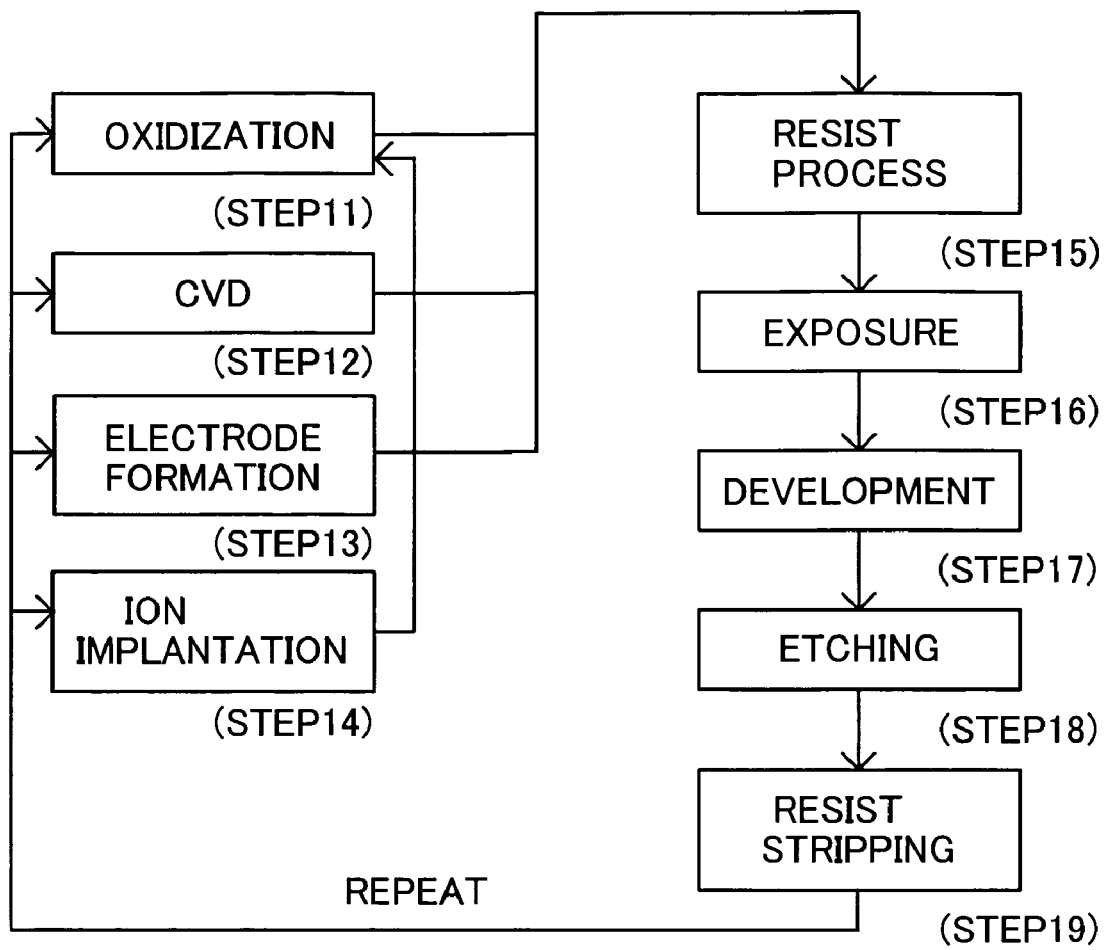
FIG. 12 is a detailed flowchart for Step 3 of wafer process shown in FIG. 11.

Referring now to FIGS. 11 and 12, a description will now be given of an embodiment of a device manufacturing method using the above exposure apparatus 1. FIG. 11 is a flowchart for explaining a fabrication of devices (i.e., semiconductor chips such as IC and LSI, LCDs, CCDs, etc.) Here, a description will be given of a fabrication of a semiconductor chip as an example. Step 1 (circuit design) designs a semiconductor device circuit. Step 2 (wafer preparation) manufactures a wafer using materials such as silicon. Step 3 (wafer process), which is referred to as a pretreatment, forms actual circuitry on the wafer through photolithography using the mask and wafer. Step 4 (assembly), which is also referred to as a post-treatment, forms into a semiconductor chip the wafer formed in Step 3 and includes an assembly step (e.g., dicing, bonding), a packaging step (chip sealing), and the like. Step 5 (inspection) performs various tests for the semiconductor device made in Step 4, such as a validity test and a durability test. Through these steps, a semiconductor device is finished and shipped (Step 6).

FIG. 12 is a detailed flowchart of the wafer process in Step 3. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This embodiment can provide higher-quality semiconductor devices than the prior art. Thus, the device manufacturing method that uses the exposure apparatus 1, and its resultant (intermediate and final) products also constitute one aspect of the present invention.

Furthermore, the present invention is not limited to these preferred embodiments and various variations and modifications may be made without departing from the scope of the present invention. For example, while the present invention describes an application of the pattern generating means to an exposure apparatus, the pattern generating means is applicable to a display unit, such as a projector, when a wafer is replaced with a screen. The above pattern generating means, the maintenance means, and a pattern generator (or a spatial light modulator) that includes a measuring means, a measuring means, and a controller, etc. constitute one aspect of the present invention.

The present invention can provide an exposure apparatus and a maintenance method, which improve the maintainability and facilitate an exchange of a pattern generator, as well as preventing defective patterning and lowered throughput.

This application claims a foreign priority benefit based on Japanese Patent Applications No. 2004-126101, filed on Apr. 21, 2004, which is hereby incorporated by reference herein in its entirety as if fully set forth herein.

What is claimed is:

1. A maintenance method for a pattern generator that includes a pattern generating unit that includes plural pixels, and generates a predetermined pattern by driving the plural pixels, said maintenance method comprising the steps of:
    obtaining one or more of an optical performance of said pattern generating unit and a driving state of the plural pixels; and
    determining, based on information obtained by said obtaining step, whether the plural pixels deteriorate; and
    maintaining the pattern generating unit based on a determination by said determining step,
    wherein said determining step determines that the plural pixels deteriorate when a changing amount of the optical performance of the pixels is outside a permissible range, and further determines whether the cumulative deterioration times is equal to or greater than a predetermined value, and
    wherein said maintaining step exchanges the pattern generating unit when the cumulative deterioration time is equal to or greater than the predetermined value, and recovers the optical performance of the pixels when the cumulative driving time of the pixels is below the predetermined value.

2. A maintenance method according to claim 1, wherein said determining step determines that the plural pixels deteriorate when a changing amount of the optical performance of the pixels is outside a permissible range, when a driving stroke of the pixels is outside a permissible range, or when the cumulative driving times of the pixels exceeds a predetermined value.

3. A maintenance method according to claim 2, wherein said maintaining step exchanges the pattern generating unit both when the changing amount of the optical performance of the pixels is outside the permissible range and when the driving state of the pixels is outside the permissible range.

4. A maintenance method according to claim 1, wherein said maintaining step includes the steps of:
    recovering a deteriorated pixel; and
    exchanging the pattern generating unit.

5. A maintenance method for a pattern generator that includes a pattern generating unit that includes plural pixels, and generates a predetermined pattern by driving the plural pixels, said maintenance method comprising:
    an obtaining step of obtaining at least one of optical performance of said pattern generating unit and a driving state of the plural pixels;
    a first determining step of determining, based on information obtained by said obtaining step, whether the optical performance of the plural pixels deteriorates;
    a second determining step of determining whether the number of determinations of deterioration is equal to or greater than a predetermined value when said first determining step determines that the optical performance deteriorates; and
    a step of exchanging the pattern generating unit when said second determining step determines that the number of determinations exceeds the predetermined value, and of recovering the optical performance of the pixels when said second determining step determines that the number of determinations is smaller than the predetermined value.

6. A maintenance method according to claim 5, further comprising:
    a third determining step of determining whether a driving state of the plural pixels deteriorates, when said first determining step determines that the optical performance does not deteriorate; and
    an exchanging step of exchanging the pattern generating unit when said third determining step determines that the driving state deteriorates.

* * * * *